(12) United States Patent
Yang et al.

(10) Patent No.: US 12,519,459 B2
(45) Date of Patent: Jan. 6, 2026

(54) FAST AND DYNAMIC VOUT-TRACKING CONTROL FOR AUDIO INPUT SIGNAL

(71) Applicant: Monolithic Power Systems, Inc., Kirkland, WA (US)

(72) Inventors: Xiangyi Yang, Chengdu (CN); Lei Li, Chengdu (CN); Wei Mao, Chengdu (CN); Panyin Liu, Chengdu (CN); Li Wang, Chengdu (CN)

(73) Assignee: Monolithic Power Systems, Inc., Kirkland, WA (US)

( * ) Notice: Subject to any disclaimer, the term of this patent is extended or adjusted under 35 U.S.C. 154(b) by 92 days.

(21) Appl. No.: 18/503,410

(22) Filed: Nov. 7, 2023

(65) Prior Publication Data

US 2024/0186993 A1    Jun. 6, 2024

(30) Foreign Application Priority Data

Dec. 2, 2022   (CN) .......................... 202211539917.X

(51) Int. Cl.
*H03K 5/00*      (2006.01)
*H03K 5/02*      (2006.01)
*H03K 17/56*     (2006.01)

(52) U.S. Cl.
CPC ............... *H03K 5/02* (2013.01); *H03K 17/56* (2013.01)

(58) Field of Classification Search
CPC ............ H03K 5/02; H03K 17/56; H03G 3/20; H03G 3/005; H03G 3/3089
See application file for complete search history.

(56) References Cited

U.S. PATENT DOCUMENTS

| 6,519,167 | B1 * | 2/2003 | Nguyen | H03F 3/217 |
| | | | | 323/280 |
| 2015/0028924 | A1 * | 1/2015 | Chao | H03K 4/90 |
| | | | | 327/133 |
| 2019/0245498 | A1 * | 8/2019 | Botti | H03K 17/687 |
| 2020/0252034 | A1 * | 8/2020 | Chadha | H03F 3/45 |
| 2024/0176574 | A1 * | 5/2024 | Tang | H03K 17/6871 |
| 2025/0015770 | A1 * | 1/2025 | Sakai | H03F 3/2171 |

FOREIGN PATENT DOCUMENTS

| CN | 106535052 A | 3/2017 |
| CN | 115209311 A | 10/2022 |

\* cited by examiner

*Primary Examiner* — Tuan T Lam
(74) *Attorney, Agent, or Firm* — Perkins Coie LLP

(57) ABSTRACT

A switch circuit includes a first audio input pin configured to receive a first audio signal having a first amplitude, a second audio input pin configured to receive a second audio signal having a second amplitude, an input pin, an output pin, and at least one switch configured to convert the input voltage to the output voltage. When a maximum of the first amplitude and the second amplitude is lower than a first threshold voltage, the output voltage is a default voltage. When the maximum of the first amplitude and the second amplitude is greater than the first threshold voltage but lower a second threshold voltage that is greater than the first threshold voltage, the output voltage is a first voltage greater. When the maximum of the first amplitude and the second amplitude is larger than the second threshold voltage, the output voltage is a second voltage.

19 Claims, 9 Drawing Sheets

FAST AND DYNAMIC VOUT-TRACKING CONTROL FOR AUDIO INPUT SIGNAL

CROSS-REFERENCE TO RELATED APPLICATIONS

This application claims priority to and the benefit of Chinese Patent Application 202211539917.X, filed on Dec. 2, 2022, which is incorporated herein by reference in its entirety.

TECHNICAL FIELD

The present invention relates to a switch. More particularly, the present invention relates to a switch circuit that receives audio signal(s).

BACKGROUND OF THE INVENTION

In an audio signal processing system, a switch circuit is often used to provide an output voltage for a back-stage circuit. When the system receives an audio signal with greater amplitude, the switch circuit needs to provide a greater output voltage to the back-stage circuit to avoid distortion when the back-stage circuits process the audio signal. When the system receives an audio signal with lower amplitude, the switch circuit only requires a lower output voltage to the back-stage circuit to avoid distortion. Nowadays most audio signal processing system often sets the output voltage provided by the switch circuit at a greater voltage value to ensure that the systems can process the audio signal with greater amplitude and also the audio signal with lower amplitude without causing distortion. However, if the output voltage of the switch circuit is set at a greater voltage, the efficiency is not ideal when the system processes the audio signals with lower amplitudes. Therefore, it is desirable to improve the efficiency of an audio signal processing system that processes audio signals with wider amplitude range.

SUMMARY OF THE INVENTION

According to an embodiment of the present invention, a switch circuit is provided. The switch circuit includes a first audio input pin, a second audio input pin, an input pin, an output pin, and at least one switch. The first audio input pin is configured to receive a first audio signal having a first amplitude. The second audio input pin is configured to receive a second audio signal having a second amplitude. The input pin is configured to receive an input voltage. The output pin is configured to provide an output voltage. The at least one switch is configured to convert the input voltage to the output voltage. The output voltage has a default voltage. When a maximum of the first amplitude and the second amplitude is lower than a first threshold voltage, the output voltage is the default voltage. When the maximum of the first amplitude and the second amplitude is greater than the first threshold voltage but lower than a second threshold voltage that is greater than the first threshold voltage, the output voltage is a first voltage that is greater than the default voltage. When the maximum of the first amplitude and the second amplitude is larger than the second threshold voltage, the output voltage is a second voltage that is greater than the first voltage.

According to an embodiment of the present invention, a control circuit for a switching converter is provided. The control circuit for a switching converter includes a first audio input pin, a second audio input pin, an output pin, and a high value selection circuit. The first audio input pin is configured to receive a first audio signal having a first amplitude. The second audio input pin is configured to receive a second audio signal having a second amplitude. The output pin is configured to provide an output voltage, wherein the output voltage has a default voltage. The high value selection circuit is configured to generate a high value signal according to the first audio signal and the second audio signal. The high value signal has an amplitude that is a maximum of the first amplitude and the second amplitude. When the high value signal increases to be greater than a first threshold voltage but lower than a second threshold voltage, the output voltage increases to a first voltage. The second threshold voltage is greater than the first threshold voltage. When the high value signal increases to be greater than the second threshold voltage, the output voltage increases to a second voltage, wherein the first voltage is greater than the default voltage, and the second voltage is greater than the first voltage.

According to an embodiment of the present invention, a control circuit for a switching converter is provided. The control circuit for a switching converter includes a first audio input pin, a second audio input pin, an output pin, and a voltage control circuit. The first audio input pin is configured to receive a first audio signal having a first amplitude. The second audio input pin is configured to receive a second audio signal having a second amplitude. The output pin is configured to provide an output voltage. The output voltage has a default voltage. The voltage control circuit is configured to compare a maximum of the first amplitude and the second amplitude with multiple voltage intervals, and provide the output voltage according to the comparison result. Each of the multiple voltage intervals corresponds to each of multiple voltage values of the output voltage. When the maximum of the first amplitude and the second amplitude is within a first voltage interval, the output voltage is a first voltage corresponding to the first interval.

BRIEF DESCRIPTION OF THE DRAWINGS

The present invention can be further understood with reference to following detailed description and appended drawings, wherein like elements are provided with like reference numerals. These drawings are only for illustration purpose, thus may only show part of the devices and are not necessarily drawn to scale.

The use of the same reference label in different drawings indicates the same or like components.

DETAILED DESCRIPTION

Various embodiments of the present invention will now be described. In the following description, some specific details, such as example circuits and example values for these circuit components, are included to provide a thorough understanding of embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the terms "left", "right", "in", "out", "front", "back", "up", "down", "top", "atop", "bottom", "on", "over", "under", "above", "below", "vertical" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The phrases "in one embodiment", "in some embodiments", "in one implementation", and "in some implementations" as used include both combinations and sub-combinations of various features described herein as well as variations and modifications thereof. These phrases used herein do not necessarily refer to the same embodiment, although they may. Those skilled in the art should understand that the meanings of the terms identified above do not necessarily limit the terms, but merely provide illustrative examples for the terms. It is noted that when an element is "connected to" or "coupled to" the other element, it means that the element is directly connected to or coupled to the other element, or that the element is indirectly connected to or coupled to the other element via another element. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Figure 1:
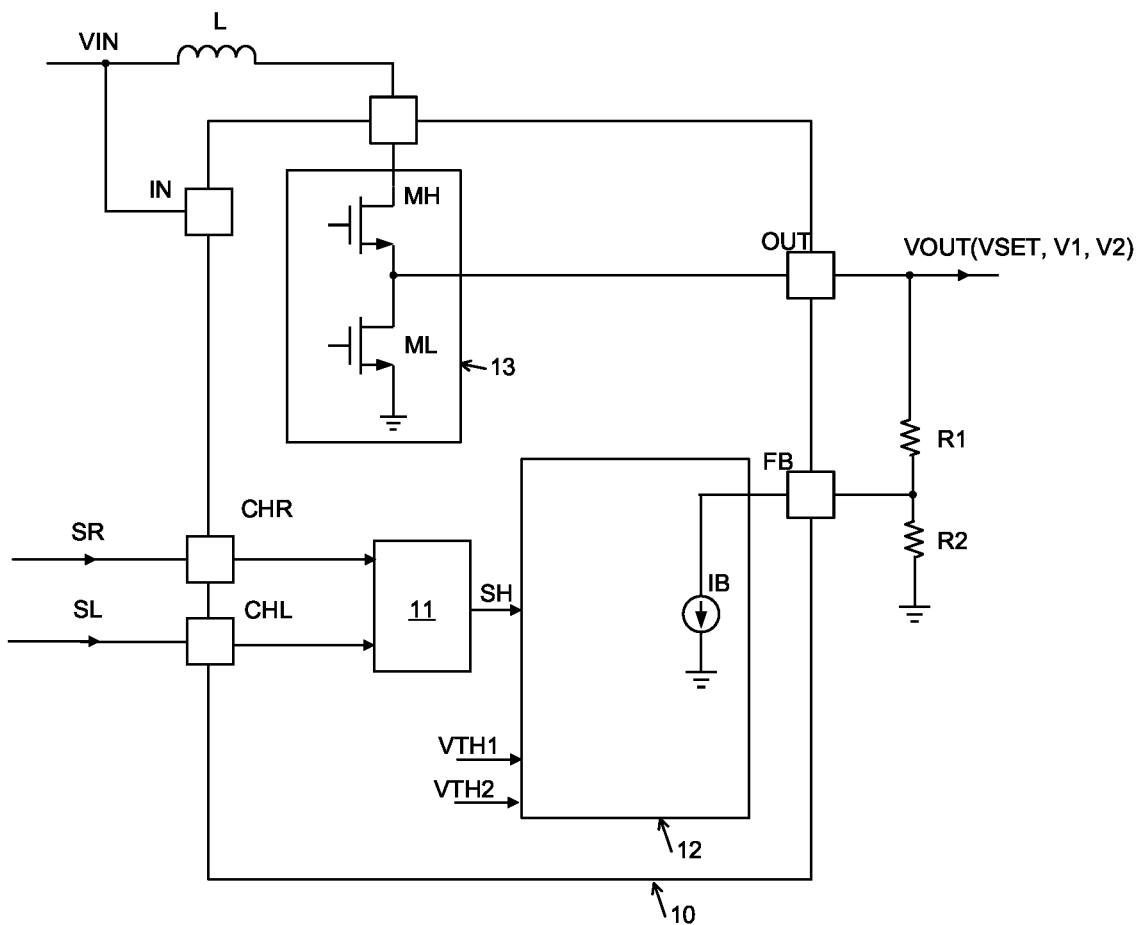
FIG. 1 is a schematic diagram of a switch circuit in accordance with an embodiment of the present invention.

FIG. 1 is a schematic diagram of a switch circuit 100 in accordance with an embodiment of the present invention. For illustration of FIG. 1, the switch circuit 100 includes a control circuit 10. The control circuit 10 includes a first audio input pin CHR, a second audio input pin CHL, an input pin IN, and an output pin OUT. The first audio input pin CHR is configured to receive a first audio signal SR. The second audio input pin CHL is configured to receive a second audio signal SL. The input pin IN is configured to receive an input voltage VIN. The output pin OUT is configured to provide an output voltage VOUT.

In the embodiment of FIG. 1, the control circuit 10 further includes at least one switch 13. By controlling the at least one switch 13 to be turned on or off, the control circuit 10 is configured to convert the input voltage VIN to the output voltage VOUT. In some embodiments, the at least one switch 13 includes a high side switch MH and a low side switch ML. In one embodiment, the high side switch MH, the low side switch ML, and an inductor L form a boost converter. By controlling the high side switch MH and the low side switch ML to be turned on and off alternatively, the control circuit 10 is configured to convert the input voltage to the output voltage VOUT greater than the input voltage VIN.

In one embodiment as shown in FIG. 1, the control circuit 10 is able to dynamically adjust the output voltage VOUT according to the audio signals SR and SL.

In some embodiments, the output voltage VOUT has a default voltage VSET. When the maximum of the amplitudes of the first audio signal SR and the second audio signal SL is greater than the first threshold voltage VTH1 but lower than a second threshold voltage VTH2, the output voltage VOUT is a first voltage V1 that is greater than the default voltage VSET. The second threshold voltage VTH2 is greater than the first threshold voltage VTH1. In some embodiments, when the maximum of the amplitudes of the first audio signal SR and the second audio signal SL is greater than the second threshold voltage VTH2, the output voltage VOUT is a second voltage V2 that is greater than the first voltage V1.

In one embodiment as shown in FIG. 1, the control circuit 10 further includes a high value selection circuit 11. The high value selection circuit 11 is configured to generate a high value signal SH according to the first audio signal SR and the second audio signal SL. For example, the high value signal SH has an amplitude that is a maximum of the first amplitude and the second amplitude.

In some embodiments, the control circuit 10 further includes a voltage control circuit 12 coupled to the high value selection circuit 11. The voltage control circuit 12 is configured to compare the high value signal SH with the first threshold voltage VTH1 and with the second threshold voltage VTH2 to provide the output voltage VOUT according to the comparison result. For example, the voltage control circuit 12 includes a controllable current source IB. In one embodiment, the switch circuit 100 further includes a feedback pin FB coupled in series with the controllable current source IB. For instance, the controllable current source IB flows from the feedback pin FB to a reference ground. The feedback pin FB is configured to receive a feedback voltage that is proportional to the output voltage VOUT (e.g., via a voltage divider, resistors R1 and R2). Accordingly, by adjusting the current value of the controllable current source IB coupled to the output pin OUT, the voltage control circuit 12 is able to control the output voltage VOUT.

In some embodiments, when the high value signal SH increases from a voltage lower than the first threshold voltage VTH1 to a voltage greater than the first threshold voltage VTH1, the controllable current source IB also increases, and thus a higher output voltage is provided at the output pin OUT. When the high value signal SH increases from a voltage greater than the first threshold voltage VTH1 but lower than the second threshold voltage VTH2 to a voltage greater than the second threshold voltage VTH2, the controllable current source IB continues to increase, and thus an even higher output voltage is provided at the output pin OUT.

In some embodiments, as shown in FIG. 1, the voltage control circuit 12 includes a current source coupled in series with the feedback pin FB. When the high value signal SH is larger than the first threshold voltage VTH1 but lower than the second threshold voltage VTH2, the current source provides a first current to make the output voltage VOUT to the first voltage V1. When the high value signal SH is larger than the second threshold voltage VTH2, the current source provides a second current to make the output voltage VOUT to the second voltage V2. The value of the first current and the value of the second current are different.

Figure 2:
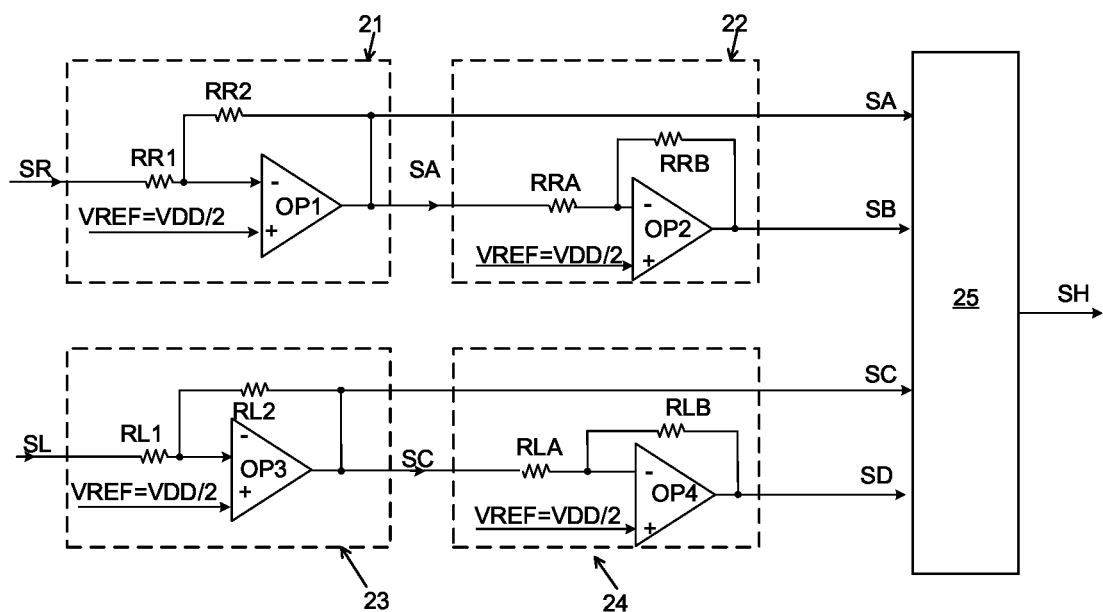
FIG. 2 is a schematic diagram of a high value selection circuit as shown in FIG. 1 in accordance with an embodiment of the present invention.

FIG. 2 is a schematic diagram of the high value selection circuit 11 as shown in FIG. 1 in accordance with an embodiment of the present invention. The high value selection circuit 11 includes a first amplitude detection circuit 21, a second amplitude detection circuit 22, a third amplitude detection circuit 23, a fourth amplitude detection circuit 24, and a comparison circuit 25. The first amplitude detection circuit 21 is configured to receive the first audio signal SR and generate a first detection signal SA according to the first audio signal SR. The phase difference between the first detection signal SA and the first audio signal SR is 180° (i.e., inverted). The amplitude of the first detection signal SA is proportional to the amplitude of the first audio signal SR. An offset of the first detection signal SA is at the reference voltage VREF. In the embodiment of FIG. 2, the reference voltage VREF is equal to the half of the supply voltage VDD. For example, the supply voltage VDD is 3.6V, and the reference voltage VREF is 1.8V.

The second amplitude detection circuit 22 is configured to receive the first detection signal SA and generate a second detection signal SB according to the first detection signal SA. The phase difference between the second detection signal SB and the first detection signal SA is 180° (i.e., inverted). The amplitude of the second detection signal SB is proportional to the amplitude of the first detection signal SA. An offset of the second detection signal SB is at the reference voltage VREF. It is worth noting that the offset of the first audio signal SR is decided by the device that generates the first audio signal SR.

The third amplitude detection circuit 23 is configured to receive the second audio signal SL and generate a third detection signal SC according to the second audio signal SL. The phase difference between the third detection signal SC and the second audio signal SL is 180° (i.e., inverted). The amplitude of the third detection signal SC is proportional to the amplitude of the second audio signal SL. An offset of the third detection signal SC is at the reference voltage VREF.

The fourth amplitude detection circuit 24 is configured to receive the third detection signal SC and generate a fourth detection signal SD according to the third detection signal SC. The phase difference between the fourth detection signal SD and the third detection signal SC is 180° (i.e., inverted). The amplitude of the fourth detection signal SD is proportional to the amplitude of the third detection signal SC. In other words, an offset of the fourth detection signal SD is at the reference voltage VREF.

The comparison circuit 25 is configured to compare the first detection signal SA, the second detection signal SB, the third detection signal SC, and the fourth detection signal SD and provide the detection signal among the detection signals SA-SD that has the largest amplitude (e.g., the maximum absolute value) within a time period as the high value signal SH.

For illustration of FIG. 2, the first amplitude detection circuit 21 includes an operational amplifier OP1 and an amplitude adjusting circuit. The operational amplifier OP1 has a first input terminal, a second input terminal, and an output terminal. The first input terminal is configured to receive the reference voltage VREF, and the output terminal is configured to provide the first detection signal SA. The amplitude adjusting circuit is coupled between the second input of the operational amplifier OP1 and the output terminal of the operational amplifier OP1. The amplitude adjusting circuit is configured to adjust the gain of the operational amplifier OP1. In one embodiment, the amplitude adjusting circuit includes a resistor RR1 and a resistor RR2. According to the resistance of the resistor RR1 and the resistance of the resistor RR2, the gain of the operational amplifier OP1 is determined. In one implementation, the resistor RR1 is coupled to the second input terminal of the operational amplifier OP1. The resistor RR2 is coupled between the second input terminal of the operational amplifier OP1 and the output terminal of the operational amplifier OP1. The operational amplifier OP1 is configured to adjust the offset of the first detection signal SA to the reference voltage VREF and adjust the amplitude of the first detection signal SA according to the gain.

The second amplitude detection circuit 22 includes an operational amplifier OP2 and an amplitude adjusting circuit. The operational amplifier OP2 has a first input terminal, a second input terminal, and an output terminal. The first input terminal is configured to receive the reference voltage VREF, and the output terminal is configured to provide the second detection signal SB. The amplitude adjusting circuit is coupled between the second input of the operational amplifier OP2 and the output terminal of the operational amplifier OP2. The amplitude adjusting circuit is configured to adjust the gain of the operational amplifier OP2. In one embodiment, the amplitude adjusting circuit includes a resistor RRA and a resistor RRB. According to the resistance of the resistor RRA and the resistance of the resistor RRB, the gain of the operational amplifier OP2 is determined. In one implementation, the resistor RRA is coupled to the second input terminal of the amplifier OP2. The resistor RRB is coupled between the second input terminal of the operational amplifier OP2 and the output terminal of the operational amplifier OP2. The operational amplifier OP2 is configured to adjust the offset of the second detection signal SB to the reference voltage VREF and adjust the amplitude of the second detection signal SB according to the gain.

As shown in FIG. 2, the third amplitude detection circuit 23 is similar to the first amplitude detection circuit 21, except that the third amplitude detection circuit 23 receives the second audio signal SL. Similarly, the fourth amplitude detection circuit 24 is similar to the second amplitude detection circuit 22.

Figure 3:
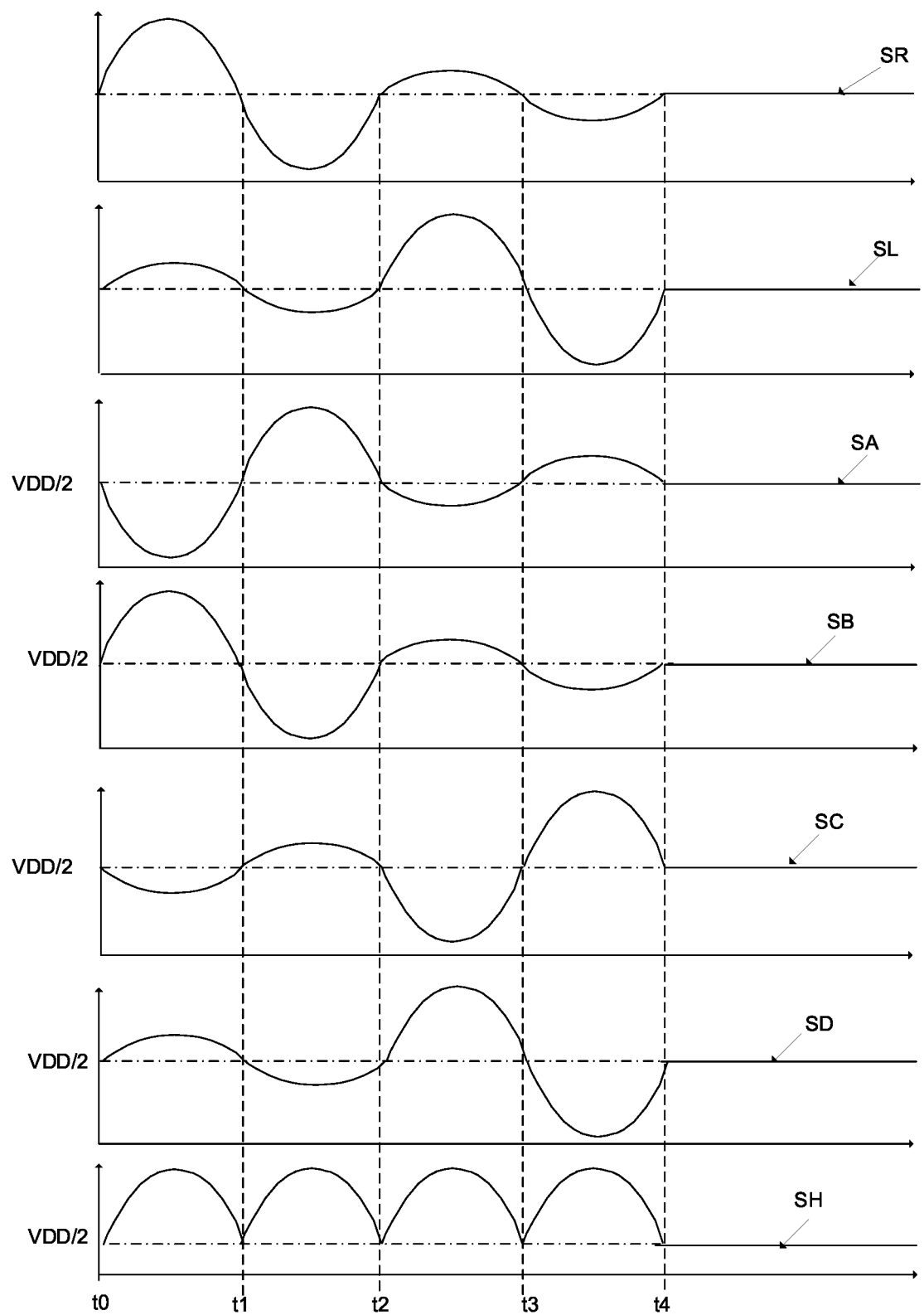
FIG. 3 is a schematic diagram for illustrating the working principle of the high value selection circuit as shown in FIG. 2 in accordance with an embodiment of the present invention.

FIG. 3 is a schematic diagram for illustrating the working principle of the high value selection circuit 11 as shown in FIG. 2 in accordance with an embodiment of the present invention. The waveforms of the first audio signal SR, the second audio signal SL, the first detection signal SA, the second detection signal SB, the third detection signal SC, the fourth detection signal SD, and the high value signal SH are shown in FIG. 3 for illustration purpose only. For instance, the first audio signal SR and the second audio signal SL are sinusoidal wave signals with changing amplitudes. The offset of the first audio signal SR and the second audio signal SL are respectively decided and generated by audio devices.

The first detection signal SA is generated according to the first audio signal SR. The phase difference between the first detection signal SA and the first audio signal SR is 180° (i.e., inverted). The amplitude of the first detection signal SA is proportional to the amplitude of the first audio signal SR. In the embodiment of FIG. 3, the first detection signal SA has the same amplitude as the first audio signal SR.

The second detection signal SB is generated according to the first detection signal SA. The phase difference between the second detection signal SB and the first detection signal SA is 180° (i.e., inverted). The amplitude of the second detection signal SB is proportional to the amplitude of the first detection signal SA. In the embodiment of FIG. 3, the second detection signal SB has the same amplitude as the first detection signal SA.

The third detection signal SC is generated according to the second audio signal SL. The phase difference between the third detection signal SC and the second audio signal SL is 180° (i.e., inverted). The amplitude of the third detection signal SC is proportional to the amplitude of the second audio signal SL. In the embodiment of FIG. 3, the third detection signal SC has the same amplitude as the second audio signal SL.

The fourth detection signal SD is generated according to the third detection signal SC. The phase difference between the fourth detection signal SD and the third detection signal SC is 180° (i.e., inverted). The amplitude of the fourth detection signal SD is proportional to the amplitude of the third detection signal SC. In the embodiment of FIG. 3, the fourth detection signal SD has the same amplitude as the third detection signal SC.

In one embodiment, a duration of the first audio signal SR and the second audio signal SL is divided into multiple time periods, and the high value selection circuit 11 obtains the maximum of the first amplitude and the second amplitude in each period as the high value signal SH. For illustration of FIG. 3, within the period between time t0 and time t1 (i.e., a positive half cycle of a sinusoidal wave), the second detection signal SB has the maximum amplitude among the detection signals SA-SD, and thus the second detection signal SB is selected as the high value signal SH for the period between time t0 and time t1. Within the period between time t1 and time t2 (i.e., a negative half cycle of a sinusoidal wave), the first detection signal SA has the maximum amplitude among the detection signals SA-SD, and thus the first detection signal SA is selected as the high value signal SH for the period between time t1 and time t2. Within the period between time t2 and time t3 (i.e., a positive half cycle of a sinusoidal wave), the fourth detection signal SD has the maximum amplitude among the detection signals SA-SD, and thus the fourth detection signal SD is selected as the high value signal SH for the period between time t2 and time t3. Within the period between time t3 and time t4 (i.e., a negative half cycle of a sinusoidal wave), the third detection signal SC has the maximum amplitude among the detection signals SA-SD, and thus the third detection signal SC is selected as the high value signal SH for the period between time t3 and time t4.

It is worth noted that the waveforms shown in FIG. 3 are merely for exemplary purpose. In another embodiment, the audio signals SR and SL are analog signals and have different and changing amplitudes and frequencies, and have waveforms different from the ones shown in FIG. 3. Moreover, in the embodiment of FIG. 3, the comparison circuit 25 compares the detection signals SA-SD within the time period of time t0-t1, time t1-t2, time t2-t3, and time t3-t4. In another embodiment, the comparison circuit 25 compares the detection signals SA-SD within a time period that is shorter or longer than the one in the embodiment of FIG. 3 and provides the detection signal that has the largest amplitude within that time period.

Figure 4A:
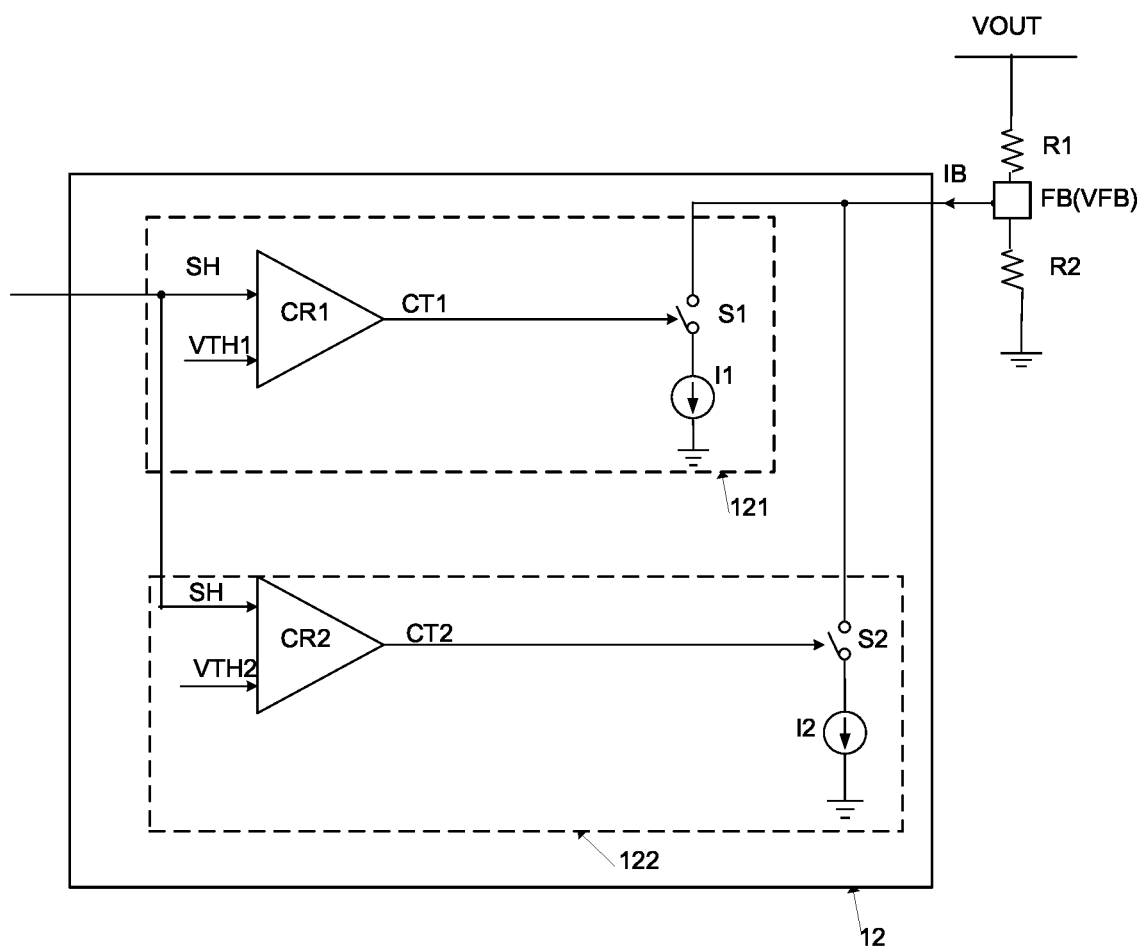
FIG. 4A is a schematic diagram of a voltage control circuit as shown in FIG. 1 in accordance with an embodiment of the present invention.

FIG. 4A is a schematic diagram of the voltage control circuit 12 as shown in FIG. 1 in accordance with an embodiment of the present invention. In this embodiment, the voltage control circuit 12 includes a first control unit 121 and a second control unit 122. The control units 121 and 122 are coupled in parallel between the feedback pin FB and the high value selection circuit 11.

The first control unit 121 includes a first comparator CR1, a first switch S1, and a first current source. The first current source is coupled in series with the feedback pin FB. In one embodiment, the first current source and the first switch S1 are coupled in series between the feedback pin FB and the reference ground. The first current source is configured to provide the first current I1. The first comparator CR1 is configured to compare the high value signal SH and the first threshold voltage VTH1 and generate a first control signal CT1 to control the first switch S1. When the high value signal SH is greater than the first threshold voltage VTH1, the first comparator CR1 is configured to provide the first control signal CT1 to turn on the first switch S1. When the high value signal SH is lower than the first threshold voltage VTH1, the first comparator CR1 is configured to provide the first control signal CT1 to turn off the first switch S1.

The second control unit 122 includes a second comparator CR2, a second switch S2, and a second current source. The first second source is coupled in series with the feedback pin FB. In one embodiment, the second current source and the second switch S2 are coupled in series between the feedback pin FB and the reference ground. The second current source is configured to provide the second current I2. The second comparator CR2 is configured to compare the high value signal SH and the second threshold voltage VTH2 and generate a second control signal CT2 to control the second switch S2. When the high value signal SH is greater than the second threshold voltage VTH2, the second comparator CR2 is configured to provide the second control signal CT2 to turn on the second switch S2. When the high value signal SH is lower than the second threshold voltage VTH2, the second comparator CR2 is configured to provide the second control signal CT2 to turn off the second switch S2.

Specifically, when the high value signal SH is lower than the first threshold voltage VTH1, the first switch S1 and the second switch S2 are both turned off, and thus the current IB flowing through the feedback pin is 0 A, and the output voltage VOUT is equal to the default voltage VSET. The default voltage VSET can be calculated according to the formula below:

$$VSET = \frac{VFB}{R2} \times (R1 + R2)$$

where the voltage VFB is the voltage at the feedback pin FB.

When the high value signal SH increases from a voltage lower than the first threshold voltage VTH1 to a voltage greater than the first threshold voltage VTH1 but lower than the second threshold voltage VTH2, the first switch S1 is turned on, and the second switch S2 is turned off. Thus the current IB flowing through the feedback pin is equal to the first current I1, and the output voltage VOUT is increased from the default voltage VSET to the first voltage V1. The first voltage V1 can be calculated according to the formula below:

$$V1 = \left(\frac{VFB}{R2} + I1\right) \times (R1 + R2)$$

When the high value signal SH increases from a voltage greater than the first threshold voltage VTH1 but lower than the second threshold voltage VTH2 to a voltage greater than the second threshold voltage VTH2, the first switch S1 and the second switch S2 are both turned on, the current IB flowing through the feedback pin is equal to the sum of the first current I1 and the second current I2, and the output voltage VOUT is increased from the first voltage V1 to the second voltage V2. The second voltage V2 can be calculated according to the formula below:

$$V2 = \left(\frac{VFB}{R2} + I1 + I2\right) \times (R1 + R2)$$

Figure 4B:
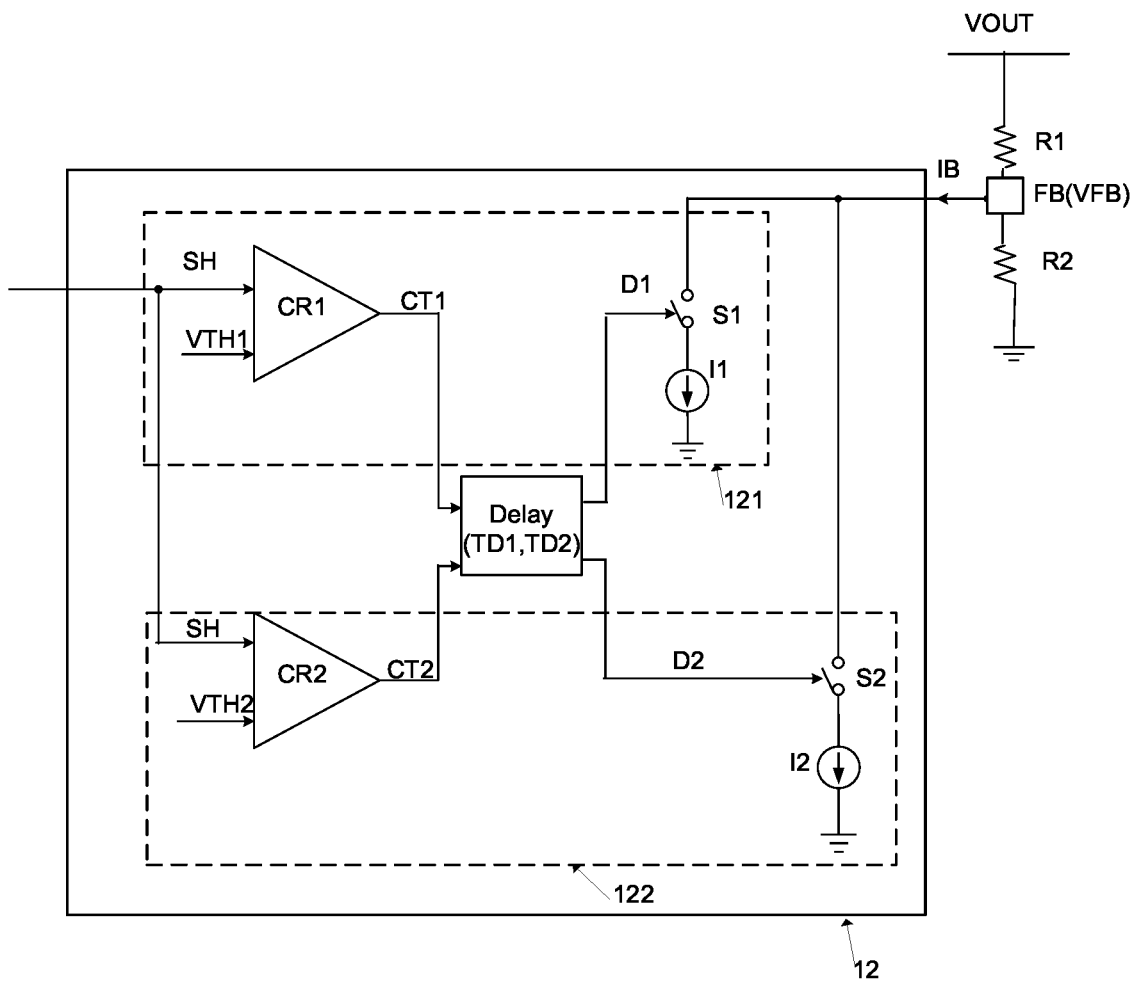
FIG. 4B is a schematic diagram of a voltage control circuit as shown in FIG. 1 in accordance with another embodiment of the present invention.

FIG. 4B is a schematic diagram of a voltage control circuit as shown in FIG. 1 in accordance with another embodiment of the present invention. Compared with the embodiment of FIG. 4A, the voltage control circuit 12 in FIG. 4B further includes a delay circuit Delay. In the embodiment of FIG. 4B, when the high value signal SH increases to be greater than the first threshold voltage VTH1 or the second threshold voltage VTH2, the first switch S1 or the second switch S2 is immediately turned on, so that the output voltage VOUT is rapidly increased to the first voltage V1 or the second voltage V2. However, on the other hand, when the high value signal SH drops from a voltage greater than the first threshold voltage VTH1 to a voltage lower than the first threshold voltage VTH1, or from a voltage greater than the second threshold voltage VTH2 to a voltage lower than the second threshold voltage VTH2, the delay circuit Delay is configured to provide a delay time period to turn off the first switch S1 or the second switch S2 after the delay time period. Accordingly, in the case where the amplitude of the high value signal SH is constantly changing within a short period of time, the output voltage VOUT does not need to change frequently.

Specifically, the delay circuit Delay is configured to receive the first control signal CT1 and the second control signal CT2 and generate a first switch control signal D1 and a second switch control signal D2 according to the first control signal CT1 and the second control signal CT2, in order to control the first switch S1 and the second switch S2 with a delay time. For instance, in the embodiment of FIG. 4, when the high value signal SH decreases from a voltage greater than the second threshold voltage VTH2 to a voltage lower than the second threshold voltage VTH2 but greater than the first threshold voltage VTH1, after a second delay time TD2, the second switch S2 is transitioned from the ON state to the OFF state. Similarly, the voltage control circuit 12 is configured to detect whether the high value signal SH is lower than the first threshold voltage VTH1. When the high value signal SH decreases from a voltage lower than the second threshold voltage VTH2 but greater than the first threshold voltage VTH1 to a voltage lower than the first threshold voltage VTH1, the first switch S1 will transition from the ON state to the OFF state after a first delay time TD1. In one implementation, the first delay time TD1 and the second delay time TD2 are both between 1 ms to 10 ms. In another implementation, the first delay time TD1 and the second delay time TD2 are both equal to 5 ms.

Figure 5:
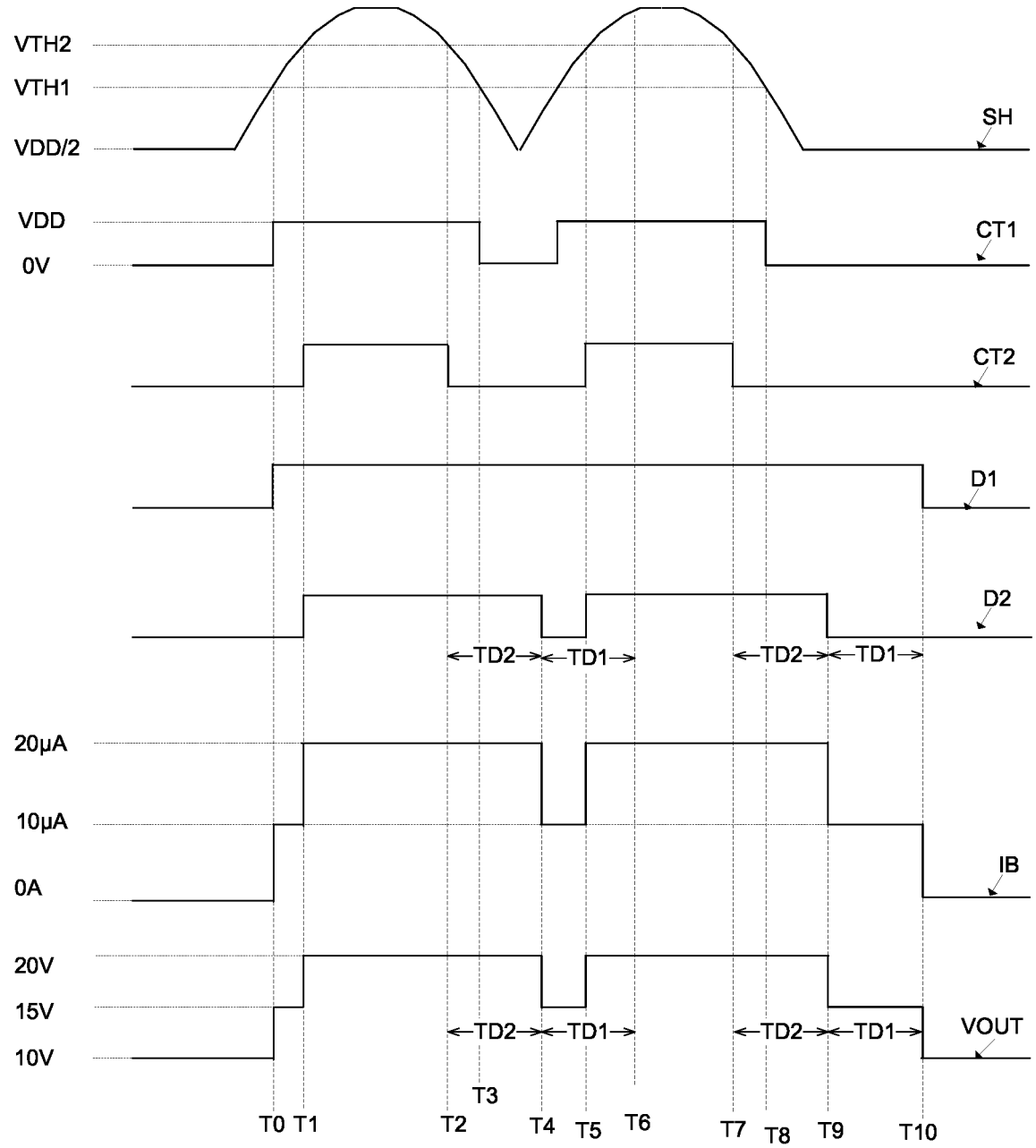
FIG. 5 is a schematic diagram for illustrating the working principle of the voltage control circuit as shown in FIG. 4B in accordance with an embodiment of the present invention.

FIG. 5 is a schematic diagram for illustrating the working principle of the voltage control circuit 12 as shown in FIG. 4B in accordance with an embodiment of the present invention. FIG. 5 shows the waveforms of the high value signal SH, the first control signal CT1, the second control signal CT2, the first switch control signal D1, the second switch control signal D2, the current IB, and the output voltage VOUT. The first control signal CT1, the second control signal CT2, the first switch control signal D1, and the second switch control signal D2 can be at a high voltage level or a low voltage level. For example, the high voltage level corresponds to the supply voltage VDD, while the low voltage level corresponds to the reference ground (e.g., 0V). For the simplicity of FIG. 5, the actual voltages of the first control signal CT1, the second control signal CT2, the first switch control signal D1, and the second switch control signal D2 are not illustrated in the figure.

Please refer to FIG. 4B and FIG. 5. In one implementation, given the resistance of the first feedback resistor R1 is 499 KΩ and the resistance of the second feedback resistor R2 is 54.9 KΩ, the voltage VFB at the feedback pin FB is 1V, the default voltage VSET could be calculated to be approximately 10V. In one implementation, given the first current I1 is 10 μA, and the second current I2 is also 10 μA, the first voltage V1 could be calculated to be approximately 15V, and the second voltage V2 could be calculated to be approximately 20V.

At time T0, the high value signal SH increases to be greater than the first threshold voltage VTH1, and therefore the first control signal CT1 transitions from the low voltage level to the high voltage level, and the first switch control signal D1 transitions from the low voltage level to the high voltage level correspondingly. The first switch S1 is turned on, the current IB transitions from 0 A to 10 μA, and the output voltage VOUT transitions from the default voltage VSET (i.e., 10V) to the first voltage V1 (i.e., 15V).

At time T1, the high value signal SH increases to be greater than the second threshold voltage VTH2, and therefore the second control signal CT2 transitions from the low voltage level to the high voltage level, and the second switch control signal D2 transitions from the low voltage level to the high voltage level correspondingly. The second switch S2 is turned on, the current IB is 20 μA, and the output voltage VOUT transitions from the first voltage V1 (i.e., 15V) to the second voltage (i.e., 20V).

At time T2, the high value signal SH decreases to be lower than the second threshold voltage VTH2, and therefore the second control signal CT2 transitions from the high voltage level to the low voltage level. After the delay time TD2, that is, at time T4, the second switch control signal D2 transitions from the high voltage level to the low voltage level, and the current IB transitions from 20 μA to 10 μA, and the output voltage VOUT transitions from 20V to 15V.

When the output voltage VOUT transitions from 20V to 15V (i.e., at time T4), after the first delay time TD1 (i.e., at time T6), the voltage control circuit 12 detects whether the high value signal SH is lower than the first threshold voltage VTH1. Since the high value signal SH is greater than the first threshold voltage VTH1 at time T6 as shown in FIG. 5, the first control signal D1 remains at the high voltage level. That is, during the time period from T0-T6, the first control signal D1 remains at the high voltage level. At time T3, the high value signal SH decreases to be lower than the first threshold voltage VTH1, and therefore the first control signal CT1 transitions from the high voltage level to the low voltage level.

At time T5, the high value signal SH increases again to be greater than the second threshold voltage VTH2, and therefore the second control signal CT2 transitions from the low voltage level to the high voltage level, and the second switch control signal D2 transitions from the low voltage level to the high voltage level correspondingly to turn on the second switch S2. Thus, the current IB transitions from 10 μA to 20 μA, and the output voltage VOUT transitions from 15V to 20V.

At time T7, the high value signal SH decreases to be lower than the second threshold voltage VTH2, and therefore the second control signal CT2 transitions from the high voltage level to the low voltage level. After the delay time TD2 (i.e., at time T9), the second switch control signal D2 transitions from the high voltage level to the low voltage level, the current IB transitions from 20 μA to 10 μA, and the output voltage VOUT transitions from 20V to 15V.

When the output voltage VOUT transitions from 20V to 15V (i.e., at time T9), after the first delay time TD1 (i.e., at time T10), the voltage control circuit 12 detects whether the high value signal SH is lower than the first threshold voltage VTH1. Since the high value signal SH is lower than the first threshold voltage VTH1 at time T10, the first control signal D1 transitions from the high voltage level to the low voltage level, the current IB transitions from 10 μA to 0 μA, and the output voltage VOUT transitions from 15V to 10V. At time T8, the high value signal SH decreases to be lower than the first threshold voltage VTH1, and therefore the first control signal CT1 transitions from the high voltage level to the low voltage level.

Figure 6:
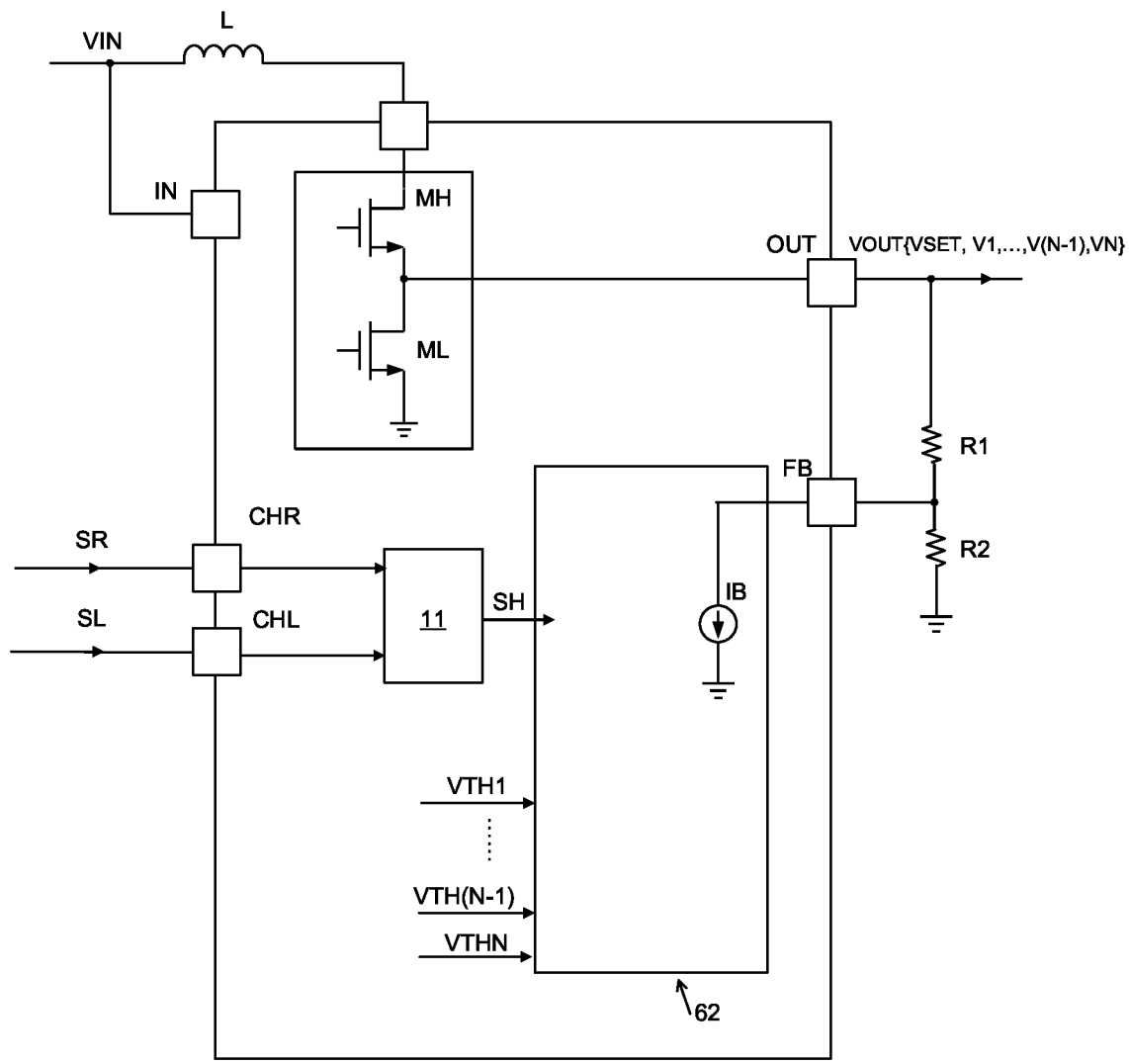
FIG. 6 is a schematic diagram of a switch circuit in accordance with another embodiment of the present invention.

FIG. 6 is a schematic diagram of a switch circuit 600 in accordance with another embodiment of the present invention. Compared with the switch circuit 100 shown in FIG. 1, the voltage control circuit 62 of the switch circuit 600 receives N threshold voltages VTH1-VTHN and is able to control the output voltage VOUT with finer adjustment. For example, with two threshold voltages VTH1 and VTH2, the output voltage VOUT is regulated to be 10V, 15V or 20V. On the other hand, for example, with N=4 threshold voltages, the output voltage VOUT could be regulated to be 10V, 12.5V, 15V, 17.5V, or 20V. In other words, with more threshold voltages (i.e., the bigger the number N is), the smoother the waveform of the transition of the output voltage VOUT could be. In one embodiment, N is larger than or equal to 2. In another embodiment, N is 40.

In one embodiment, multiple voltage intervals are compared with the maximum amplitude of the first audio signal and the second audio signal. The voltage intervals are determined by the threshold voltages VTH1-VTHN. For example, the first voltage interval is between the first threshold voltage VTH1 and the second threshold voltage VTH2, the second voltage interval is between the second threshold voltage VTH2 and the third threshold voltage VTH3, and so on. Each of the voltage intervals corresponds to each of multiple voltage values V1-VN of the output voltage VOUT. For example, when the maximum of the first amplitude and the second amplitude is within the first voltage interval, the output voltage is the first voltage V1 corresponding to the first interval, and when the maximum of the first amplitude and the second amplitude is within the second voltage interval, the output voltage is the first voltage V2 corresponding to the second interval, and so on.

Figure 7:
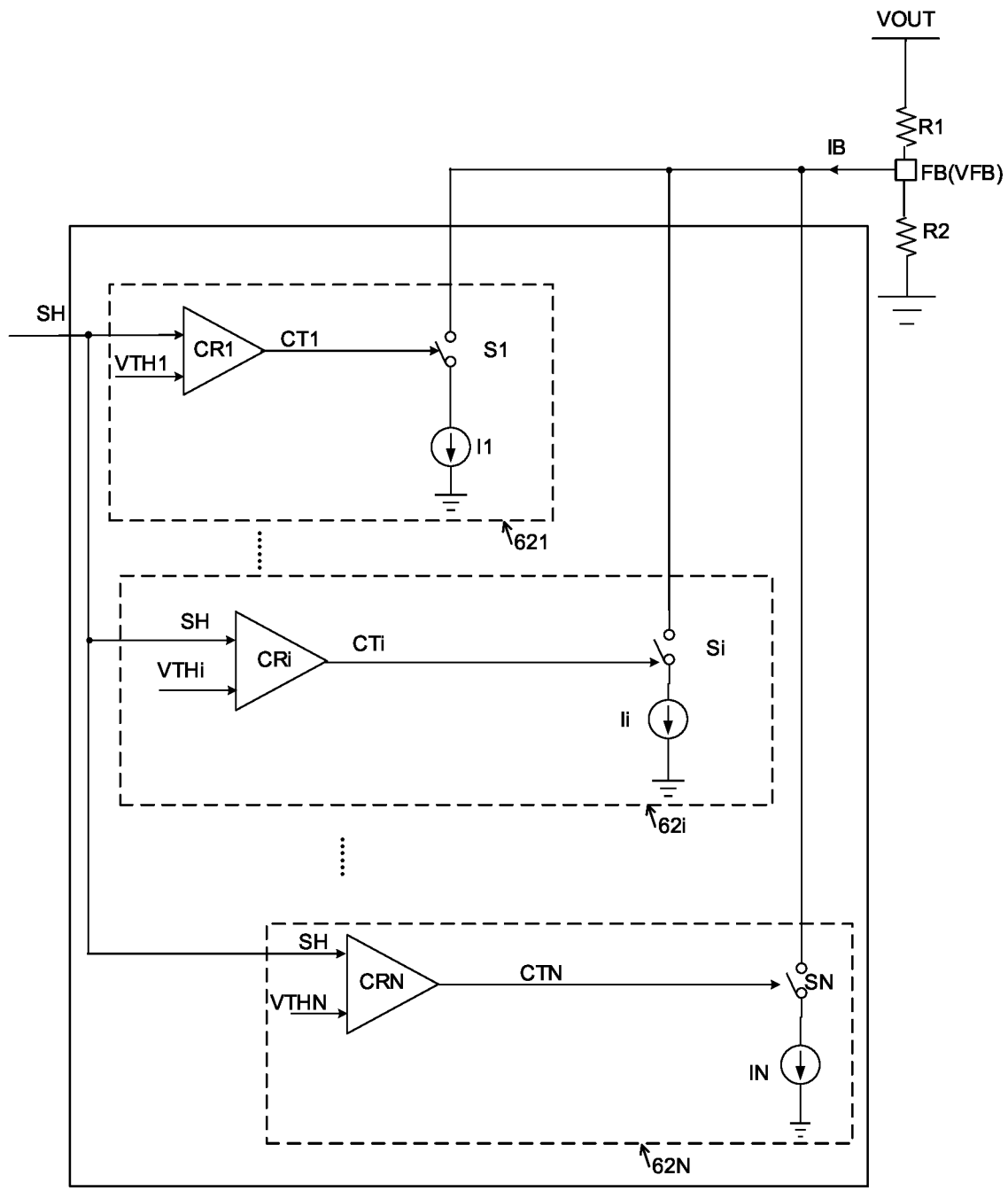
FIG. 7 is a schematic diagram of a voltage control circuit as shown in FIG. 6 in accordance with an embodiment of the present invention.

FIG. 7 is a schematic diagram of the voltage control circuit 62 as shown in FIG. 6 in accordance with an embodiment of the present invention. Compared with the voltage control circuit 12 shown in FIG. 4A, the voltage control circuit 62 includes N control units 621-62N. Each of the control units 621-62N has the similar circuit as the first control unit 121 shown in FIG. 4A. Specifically, the $i^{th}$ control unit 62$i$ includes an $i^{th}$ comparator CRi, an $i^{th}$ switch Si, and an $i^{th}$ current source. The $i^{th}$ current source and the $i^{th}$ switch Si are coupled in series between the feedback pin FB and the reference ground. The $i^{th}$ current source is configured to provide an $i^{th}$ current Ii. The $i^{th}$ comparator CRi is configured to compare the high value signal SH and the $i^{th}$ threshold voltage VTHi and generate an $i^{th}$ control signal CTi to control the $i^{th}$ switch Si. When the high value signal SH is greater than the $i^{th}$ threshold voltage VTHi, the $i^{th}$ comparator CRi is configured to provide the $i^{th}$ control signal CTi to turn on the $i^{th}$ switch Si. When the high value signal SH is lower than the $i^{th}$ threshold voltage VTHi, the $i^{th}$ comparator CRi is configured to provide the $i^{th}$ control signal CTi to turn off the $i^{th}$ switch Si. i is an integer between 1 and N, and N is an positive integer larger than 1.

In other words, the voltage control circuit 62 includes multiple current sources, multiple comparators CR1-CRN, and multiple switches S1-SN. Each current source is coupled in series with the feedback pin FB and is configured to provide a reference current. Each of the comparators CR1-CRN is configured to compare the maximum of the first amplitude and the second amplitude with each of the threshold voltages VTH1-VTHN and provide a control signal in response to the comparison result. Each of the switches S1-SN is configured to be turned on or turned off in response to the corresponding control signal.

Figure 8:
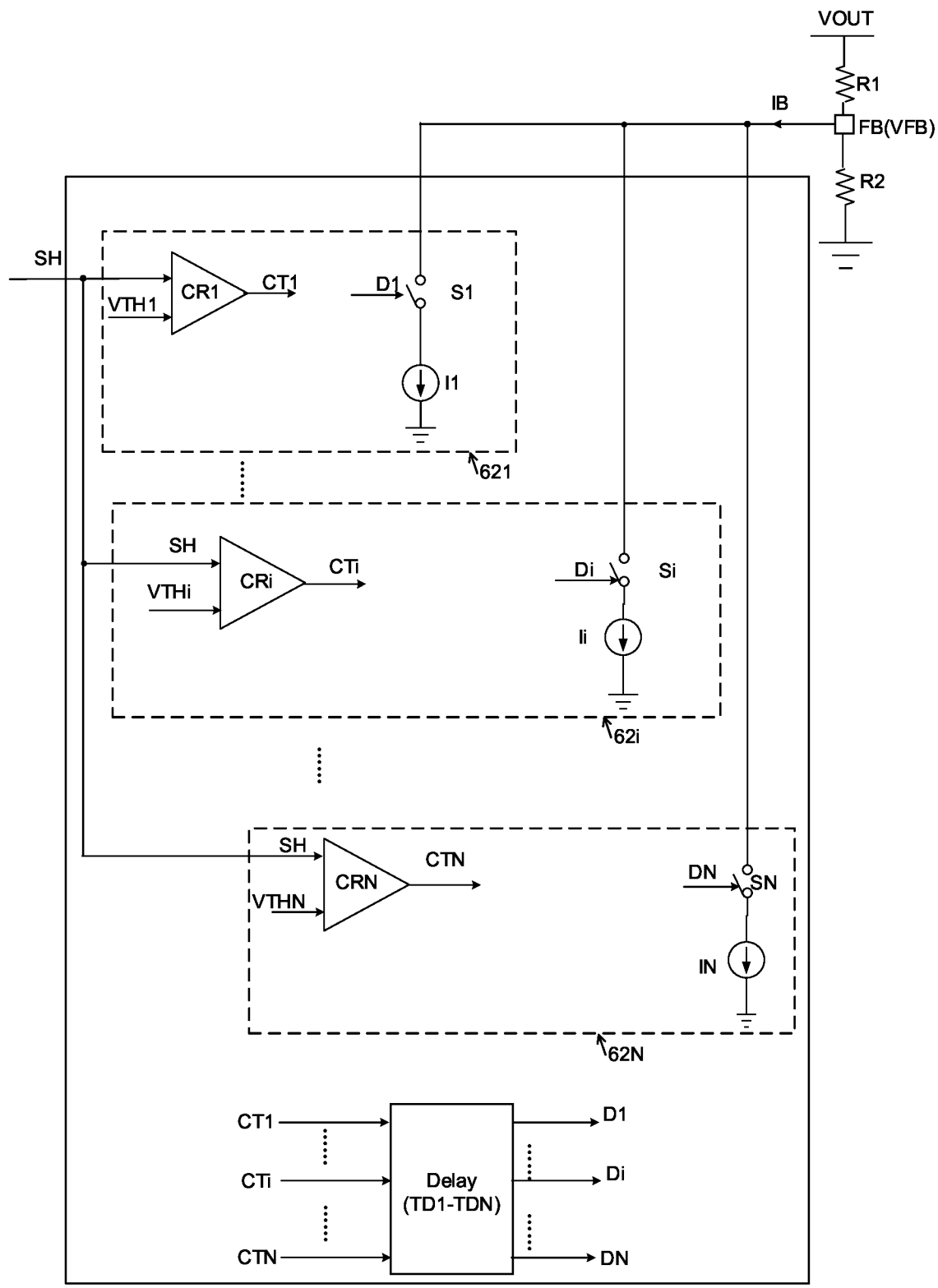
FIG. 8 is a schematic diagram of a voltage control circuit as shown in FIG. 6 in accordance with another embodiment of the present invention.

FIG. 8 is a schematic diagram of the voltage control circuit 62 as shown in FIG. 6 in accordance with another embodiment of the present invention. Compared with the embodiment of FIG. 7, the voltage control circuit in FIG. 8 further includes the delay circuit Delay. In the embodiment of FIG. 8, the delay circuit Delay is configured to receive the control signals CT1-CTN and generate control signals D1-DN according to the control signals CT1-CTN, in order to control the switches CT1-CTN. In one embodiment, when the high value signal SH decreases from a voltage greater than the $i^{th}$ threshold voltage VTHi to a voltage lower than the $i^{th}$ threshold voltage VTHi, the $i^{th}$ switch Si will be turned off after an $i^{th}$ delay time TDi. When the $i^{th}$ switch Si is turned off, the voltage control circuit 62 is configured to detect whether the high value signal SH is lower than an $(i-1)^{th}$ threshold voltage VTH(i-1). If the high value signal SH is lower than the $(i-1)^{th}$ threshold voltage VTH(i-1), an $(i-1)^{th}$ switch S(i-1) will be turned off after an $(i-1)^{th}$ delay time TD(i-1). The voltage control circuit 62 in FIG. 8 detects whether the high value signal SH is lower than each of the received threshold voltages in turn, until it detects whether the high value signal SH is lower than the first threshold voltage VTH1. If the high value signal SH is lower than the first threshold voltage VTH1, the first switch S1 will be turned off after the first delay time TD1.

The switch circuit disclosed in the present invention is able to adjust the output voltage according to the amplitude of the received audio signals. When the amplitude of the audio signals increases, the switch circuit generates an output voltage with a greater voltage value. When the amplitude of the audio signals decreases, the switch circuit generates an output voltage with a lower voltage value. Accordingly, by detecting the changing amplitude, the output voltage could be adjusted dynamically, and thus the efficiency of the switch circuit disclosed herein is improved.

While various embodiments have been described above to illustrate the switch circuit of the present invention, it should be understood that they have been presented by way of example only, and not limitation. Rather, the scope of the present invention is defined by the following claims and includes combinations and sub-combinations of the various features described above, as well as variations and modifications thereof, which would occur to persons skilled in the art upon reading the foregoing description.

What is claimed is:

1. A switch circuit, comprising:
a first audio input pin configured to receive a first audio signal having a first amplitude;
a second audio input pin configured to receive a second audio signal having a second amplitude;
an input pin configured to receive an input voltage;
an output pin configured to provide an output voltage; and
at least one switch configured to convert the input voltage to the output voltage, wherein the output voltage has a default voltage;
a high value selection circuit configured to generate a high value signal according to the first audio signal and the second audio signal, wherein the high value signal has an amplitude that is a maximum of the first amplitude and the second amplitude;
wherein when the high value signal increases to be greater than a first threshold voltage but lower than a second threshold voltage that is greater than the first threshold voltage, the output voltage increases to a first voltage that is greater than the default voltage; and
when the high value signal increases to be greater than the second threshold voltage, the output voltage increases to a second voltage that is greater than the first voltage.

2. The switch circuit of claim 1, wherein the high value selection circuit is further configured to divide a duration of the first audio signal and the second audio signal into multiple time periods, and compare the first amplitude of the first audio signal and the second amplitude of the second audio signal during each time period, and provide the maximum of the first amplitude and the second amplitude in each time period as the high value signal.

3. The switch circuit of claim 1, wherein the high value selection circuit comprises:
a first amplitude detection circuit configured to receive the first audio signal from the first audio input pin and generate a first detection signal according to the first audio signal, wherein a phase difference between the first detection signal and the first audio signal is 180°, an amplitude of the first detection signal is proportional to an amplitude of the first audio signal, and an offset of the first detection signal is at a reference voltage;
a second amplitude detection circuit configured to receive the first detection signal from the first amplitude detection circuit and generate a second detection signal according to the first detection signal, wherein a phase difference between the second detection signal and the first detection signal is 180°, an amplitude of the second detection signal is proportional to the amplitude of the first detection signal, and an offset of the second detection signal is at the reference voltage;
a third amplitude detection circuit configured to receive the second audio signal from the second audio input pin and generate a third detection signal according to the second audio signal, wherein a phase difference between the third detection signal and the second audio signal is 180°, an amplitude of the third detection signal is proportional to an amplitude of the second audio signal, and an offset of the third detection signal is at the reference voltage;
a fourth amplitude detection circuit configured to receive the third detection signal from the third amplitude detection circuit and generate a fourth detection signal according to the third detection signal, wherein a phase difference between the fourth detection signal and the third detection signal is 180°, an amplitude of the fourth detection signal is proportional to the amplitude of the third detection signal, and an offset of the fourth detection signal is at the reference voltage; and
a comparison circuit configured to receive the first detection signal, the second detection signal, the third detection signal, and the fourth detection signal, compare the first, second, third, and fourth detection signals in multiple time periods, and provide one of the first, second, third, and fourth detection signals with the largest amplitude within each time period as the high value signal.

4. The switch circuit of claim 3, wherein each of the first, second, third, and fourth amplitude detection circuits comprises:
an operational amplifier including a first input terminal, a second input terminal, and an output terminal, wherein the first input terminal of the operational amplifier is configured to receive the reference voltage; and
an amplitude adjusting circuit coupled between the second input terminal of the operational amplifier and the output terminal of the operational amplifier.

5. The switch circuit of claim 4, wherein the amplitude adjusting circuit comprises:
a first resistor coupled to the second input terminal of the operational amplifier; and
a second resistor coupled between the second input terminal of the operational amplifier and the output terminal of the operational amplifier;
wherein the amplitude adjusting circuit is configured to adjust a gain of the operational amplifier according to a resistance of the first resistor and a resistance of the second resistor.

6. The switch circuit of claim 1, further comprising:
a voltage control circuit, coupled to the high value selection circuit, configured to compare the high value signal with the first and second threshold voltages to provide the output voltage according to the comparison result.

7. The switch circuit of claim 6, further comprising:
a feedback pin configured to receive a feedback voltage proportional to the output voltage;
wherein the voltage control circuit includes a current source coupled in series with the feedback pin;
wherein the current source provides a first current to make the output voltage to the first voltage when the high value signal is larger than the first threshold voltage but lower than the second threshold voltage; and
wherein the current source provides a second current to make the output voltage to the second voltage when the high value signal is larger than the second threshold voltage.

8. The switch circuit of claim 6, further comprising:
a feedback pin configured to receive a feedback voltage proportional to the output voltage;
wherein the voltage control circuit includes:
a first current source, coupled in series with the feedback pin, configured to provide a first current;
a first comparator configured to compare the high value signal with the first threshold voltage, and provide a first control signal in response to the comparison result;
a first switch, coupled between the first current source and the feedback pin, configured to be turned on or turned off in response to the first control signal;
a second current source, coupled in series with the feedback pin, configured to provide a second current;

a second comparator configured to compare the high value signal with the second threshold voltage, and provide a second control signal in response to the comparison result; and a second switch, coupled between the second current source and the feedback pin, configured to be turned on or turned off in response to the second control signal;

wherein when the first switch is turned on, the first current is provided to the feedback pin to control the output voltage; and when the second switch is turned on, the second current is provided to the feedback pin to control the output voltage.

9. The switch circuit of claim 1, wherein when the high value signal decreases to be lower than the first threshold voltage, the output voltage decreases to the default voltage after a first delay time.

10. The control circuit of claim 9, wherein the first delay time is between 1 ms to 10 ms.

11. The switch circuit of claim 1, wherein when the high value signal decreases to be lower than the second threshold voltage but greater than the first threshold voltage, the output voltage decreases to the first voltage after a second delay time.

12. The control circuit of claim 11, wherein the second delay time is between 1 ms to 10 ms.

13. A control circuit for a switching converter, comprising:
a first audio input pin configured to receive a first audio signal having a first amplitude;
a second audio input pin configured to receive a second audio signal having a second amplitude;
an output pin configured to provide an output voltage, wherein the output voltage has a default voltage; and
a high value selection circuit configured to generate a high value signal according to the first audio signal and the second audio signal, wherein the high value signal has an amplitude that is a maximum of the first amplitude and the second amplitude;
wherein when the high value signal increases to be greater than a first threshold voltage but lower than a second threshold voltage, the output voltage increases to a first voltage, wherein the second threshold voltage is greater than the first threshold voltage;
when the high value signal increases to be greater than the second threshold voltage, the output voltage increases to a second voltage, wherein the first voltage is greater than the default voltage, and the second voltage is greater than the first voltage.

14. The control circuit of claim 13, wherein when the high value signal decreases to be lower than the second threshold voltage but greater than the first threshold voltage, the output voltage decreases to the first voltage after a second delay; and
when the high value signal decreases to be lower than the first threshold voltage, the output voltage decreases to the default voltage after a first delay.

15. The control circuit of claim 13, further comprising:
a feedback pin configured to receive a feedback voltage proportional to the output voltage; and
a voltage control circuit, coupled between the high value selection circuit and the feedback pin, configured to compare the high value signal with the first threshold voltage and with the second threshold voltage, and control the output voltage according to the comparison result.

16. The control circuit of claim 13, further comprising:
an input terminal configured to receive an input voltage; and
at least one switch configured to convert the input voltage to the output voltage, wherein the output voltage is greater than the input voltage.

17. A control circuit for a switching converter, comprising
a first audio input pin configured to receive a first audio signal having a first amplitude;
a second audio input pin configured to receive a second audio signal having a second amplitude;
an output pin configured to provide an output voltage, wherein the output voltage has a default voltage; and
a voltage control circuit configured to compare a maximum of the first amplitude and the second amplitude with multiple voltage intervals, and provide the output voltage according to the comparison result;
wherein each of the multiple voltage intervals corresponds to each of multiple voltage values of the output voltage; and
when the maximum of the first amplitude and the second amplitude is within a first voltage interval, the output voltage is a first voltage corresponding to the first interval.

18. The control circuit of claim 17, further comprising:
a feedback pin configured to receive a feedback voltage proportional to the output voltage;
wherein the voltage control circuit includes:
multiple current sources, wherein each current source is coupled in series with the feedback pin, and is configured to provide a reference current;
multiple comparators, wherein each comparator is configured to compare the maximum of the first amplitude and the second amplitude with each of multiple threshold voltages, and provide a control signal in response to the comparison result; and
multiple switches, wherein each switch is coupled between each of the current source and the feedback pin, and is configured to be turned on or turned off in response to the corresponding control signal.

19. The control circuit of claim 18, wherein the voltage control circuit further comprises:
a delay circuit configured to receive the control signals from the comparators, generate multiple delay control signals according to the control signals, and provide the corresponding delay control signal to each of the switches.

* * * * *